United States Patent [19]
Hongu et al.

[11] 3,974,460
[45] Aug. 10, 1976

[54] HIGH FREQUENCY MODULATOR, SUCH AS AN AMPLITUDE MODULATOR, INCLUDING A FREQUENCY MULTIPLIER

[75] Inventors: Masayuki Hongu, Komae; Tsutomu Niimura, Tokyo, both of Japan

[73] Assignee: Sony Corporation, Tokyo, Japan

[22] Filed: May 12, 1975

[21] Appl. No.: 576,737

[30] Foreign Application Priority Data
May 30, 1974 Japan............................... 49-61181

[52] U.S. Cl. ............................ 332/31 T; 325/139; 325/153; 325/182; 331/76; 331/116 R; 332/37 R; 332/38; 332/40; 332/43 B
[51] Int. Cl.² ..................... H03C 1/06; H03C 1/36
[58] Field of Search ............. 332/31 R, 31 T, 37 R, 332/38, 40, 41, 42, 43 R, 43 B, 44; 325/62, 139, 153, 182

[56] References Cited
UNITED STATES PATENTS

| | | | |
|---|---|---|---|
| 3,866,148 | 2/1975 | Lisle, Jr. et al. | 332/31 T |
| 3,887,886 | 6/1975 | Okada et al. | 332/43 B |

Primary Examiner—Siegfried H. Grimm
Attorney, Agent, or Firm—Lewis H. Eslinger; Alvin Sinderbrand

[57] ABSTRACT

A high-frequency modulator circuit including a frequency multiplier comprised of a first differential amplifier for receiving a base oscillating signal and for multiplying the frequency of the base oscillating signal to thereby produce a higher frequency carrier signal; and a modulating circuit connected to the first differential amplifier for modulating the carrier signal with input information. The first differential amplifier includes a pair of output terminals; and the modulating circuit is comprised of a second and third differential amplifier, each having a pair of input terminals connected to the respective output terminals of the first differential amplifier such that the higher frequency carrier signal is applied differentially to each of the second and third differential amplifiers. The second and third differential amplifiers each includes a pair of output terminals, the second differential amplifier output terminals being connected to oppositely phased ones of the third differential amplifier output terminal. The input information is supplied to at least one of the second and third differential amplifiers to thereby vary the higher frequency carrier currents which flow therethrough.

10 Claims, 9 Drawing Figures

FIG. 1
PRIOR ART
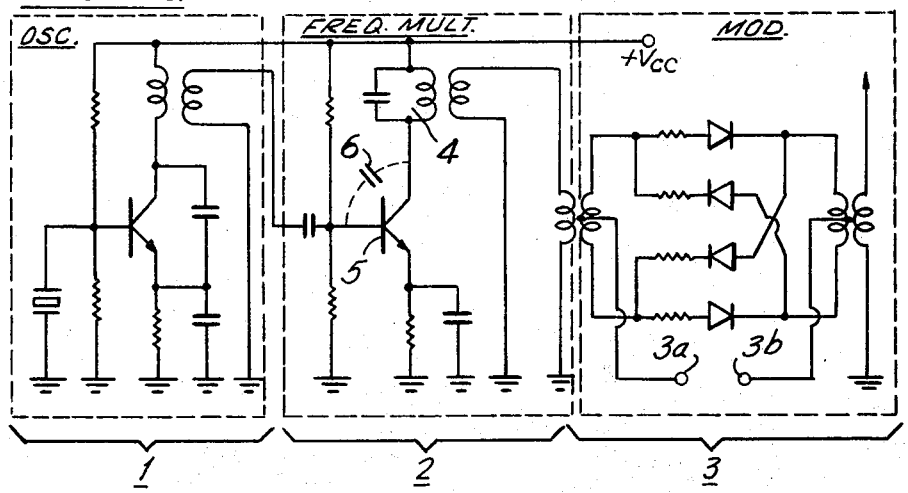
FIG. 2
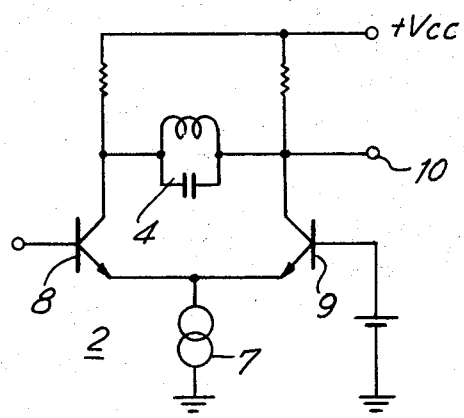
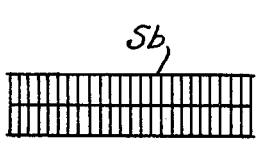
FIG. 4B
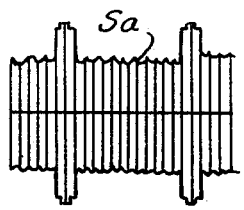
FIG. 4A
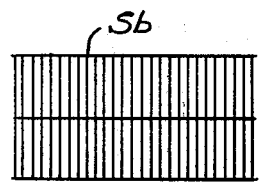
FIG. 4D
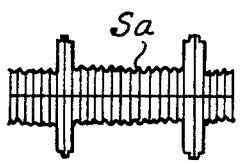
FIG. 4C
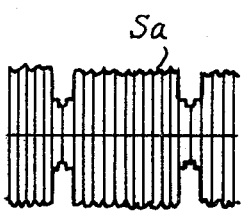
FIG. 4F
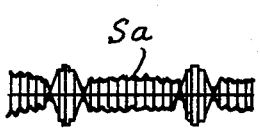
FIG. 4E

HIGH FREQUENCY MODULATOR, SUCH AS AN AMPLITUDE MODULATOR, INCLUDING A FREQUENCY MULTIPLIER

BACKGROUND OF THE INVENTION

This invention relates to a modulator circuit and, more particularly, to a higher frequency modulator circuit wherein undesired lower frequency leakage components which are related to the carrier frequency are substantially prevented from influencing the modulator output.

The modulation of a carrier signal by an information signal is used in various communication applications. In one typical application television signals are modulated onto a high-frequency carrier. It is conventional to modulate the carrier with a video signal by using typical amplitude modulation techniques. Such amplitude modulation of the video signal is used for the transmission of television broadcasts and, additionally, is used to supply a television receiver with video signals which previously had been recorded, as on a typical video recorder (VTR).

In many amplitude modulation applications, such as in the aforenoted video signal modulation application, it is necessary to modulate a very high frequency carrier with the information signal. Generally, it is often difficult to produce directly the necessary high frequency carrier. Also, the requisite circuitry which would be needed for the direct production of such a high frequency carrier signal is quite expensive.

Accordingly, in a typical high frequency modulator, a base oscillating signal having a relatively lower frequency is produced by a conventional oscillator circuit, and this base oscillating signal is frequency multiplied in a frequency multiplying circuit to thus produce the necessary carrier signal. The output of the frequency multiplier then can be supplied to any desired modulator to effect the high frequency modulation of an information signal. However, in many of the frequency multipliers which have been used heretofore, the output high frequency carrier signal often is accompanied by components of the lower frequency base oscillating signal. These accompanying components lead to errors in the resultant modulator output and it is desired to suppress such components. To this effect, it might be thought that the frequency multipler circuit can be particularly designed whereby the aforenoted lower frequency components are prevented from appearing in the higher frequency carrier signal output. Although such a particular design might be generally successful, it is envisaged that, at the high frequencies under consideration, the particular characteristics of circuit components might contribute to the problem of undesired lower frequency components in the carrier signal.

OBJECTS OF THE INVENTION

Therefore, it is an object of the present invention to provide an improved high frequency modulator wherein a base oscillating signal is frequency multiplied to produce a carrier signal and the occurrence of lower frequency components related to the carrier frequency are prevented from influencing the ouput of the modulator circuit.

It is another object of the present invention to provide an improved modulator circuit wherein lower frequency components which are related to the higher frequency carrier are effectively cancelled in the modulator circuit.

A further object of this invention is to provide an improved high frequency modulator circuit which is relatively inexpensive to construct and which may be formed as an integrated circuit.

Various other objects and advantages of the present invention will become apparent from the forthcoming detailed description and the novel features will be particularly pointed out in the appended claims.

SUMMARY OF THE INVENTION

In accordance with the present invention, a high frequency modulator is provided, including a frequency multiplier which is comprised of a first differential amplifier and which is supplied with a base oscillating signal to produce a carrier signal having a frequency which is a multiple of the base oscillating signal frequency; and a modulating circuit which is comprised of second and third differential amplifiers, each of said second and third differential amplifiers being supplied differentially with the carrier signal and for modulating same with input information; the second and third differential amplifiers each having a pair of output terminals; the output terminals of the second differential amplifier being connected to oppositely phased ones of the output terminals of the third differential amplifier to thereby cancel any of the base oscillating signal which might accompany the carrier signal supplied to the differential amplifier. The input information is supplied to at least one of the second and third differential amplifiers.

BRIEF DESCRIPTION OF THE DRAWINGS

The following detailed description will best be understood in conjunction with the accompanying drawings in which:

FIG. 1 is a schematic diagram of a typical high frequency modulator circuit which has heretofore been used;

FIG. 2 is a schematic diagram of a frequency multiplier which can be used with the present invention;

FIGS. 4A through 4F are waveform diagrams which are useful in understanding the operation of the embodiment shown in FIG. 3.

DETAILED DESCRIPTION OF A CERTAIN ONE OF THE PREFERRED EMBODIMENTS

Figure 3:
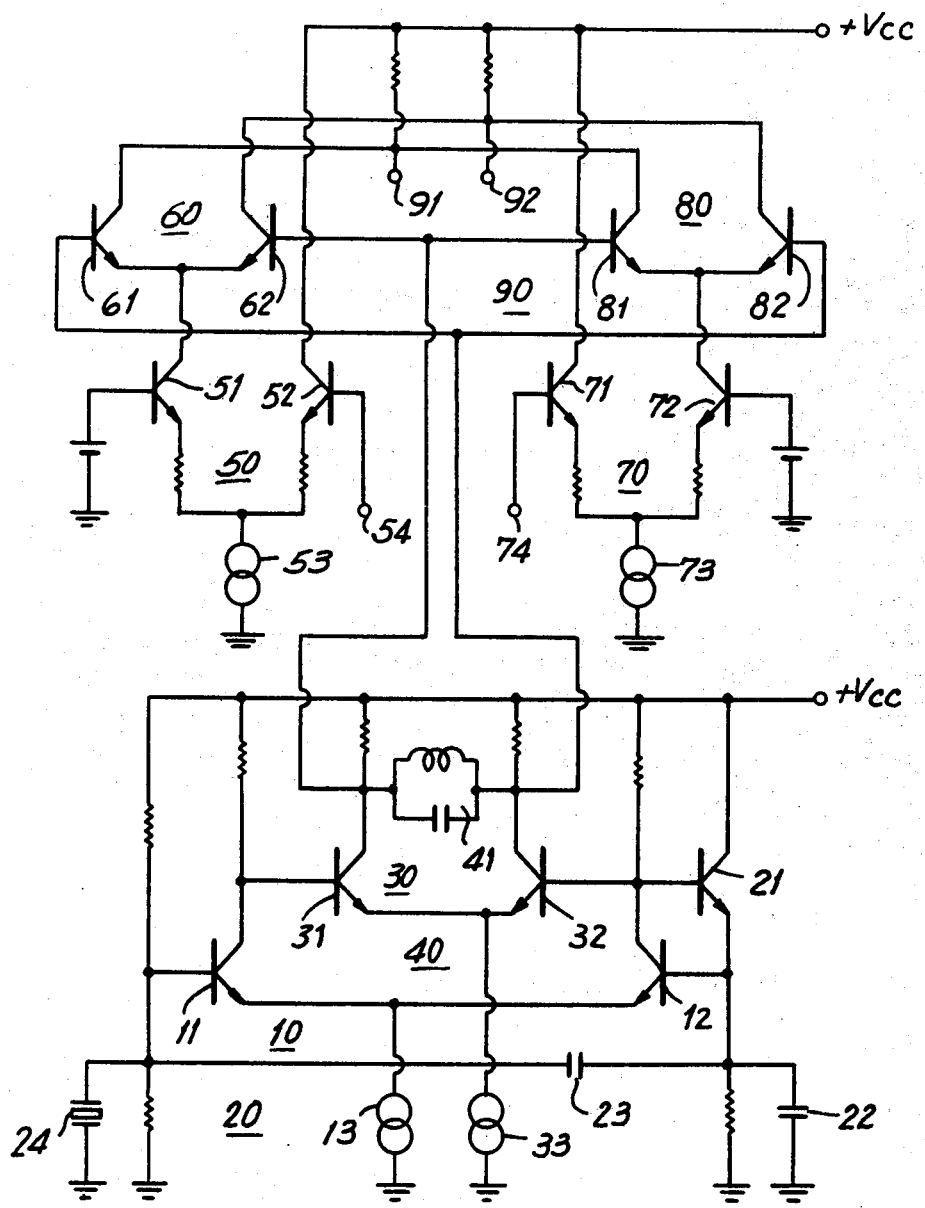
FIG. 3 is a schematic diagram of one embodiment of the high frequency modulator in accordance with this invention.

Before proceeding with a description of one embodiment of the present invention, the advantageous features thereof will be fully appreciated by first referring to a typical modulator circuit which has heretofore been used. Such a modulator circuit is shown in FIG. 1 wherein an input information signal applied to terminals 3a, 3b is adapted to modulate a high frequency carrier signal. Accordingly, the modulator circuit is formed of an oscillator 1 which is connected to a frequency multiplier 2, the output of which being supplied to the amplitude modulator 3. It is recalled that the direct production of a high frequency carrier is difficult; and therefore the oscillator 1 is provided to produce a base oscillating signal whose frequency is multiplied in the frequency multiplier 2. As a numerical example, the frequency of the base oscillating signal may, for example, be 30MHz.

The frequency multiplier 2 is formed of a transistor 5 having a resonant circuit 4 as a collector load. The resonant circuit is, typically, an L-C circuit having a resonant frequency equal to the desired carrier frequency. As a numerical example, the carrier frequency may, for example, be 90MHz. Accordingly, the base oscillating signal is supplied to the transistor 5 which, in cooperation with the resonant collector load, serves to multiply the frequency of the base oscillating signal and to supply the multiplied frequency to the amplitude modulator 3. The amplitude modulator is shown as a typical ring modulator, as is conventional.

When the typical circuit shown in FIG. 1 is used, lower frequency components corresponding to the base oscillating signal of 30MHz often appear at the output of the frequency multiplier and, undesirably, are supplied to the amplitude modulator. This phenomenon can be explained by realizing that the resonant circuit 4 must have a finite Q, which means that an effective resistive component can be considered to be in parallel with the resonant circuit. This resistive component in the collector load of the transistor 5 permits a leakage component of the input base oscillating signal to flow through the transistor and to be coupled to the amplitude modulator.

Another source of the lower frequency leakage component in the frequency multiplier output is the "floating" capacitance which is inherent between the base and collector electrodes of the transistor 5. At the frequencies under consideration, such capacitance serves to capacitively couple the base oscillating signal applied to the transistor base electrode to the collector electrode, and thus to the output of the frequency multipler.

It is thought that the aforenoted undesirable appearance of the lower frequency base signal component in the frequency multiplier output can be avoided by redesigning the multiplier circuit. One such multiplier circuit might be of the type shown in FIG. 2. As shown, the frequency multiplier is comprised of a differential amplifier formed of the differentially-connected transistors 8 and 9 having the resonant circuit 4 connected across the collector electrodes, or output terminals, thereof. If the base oscillating signal is applied to one of the differentially-connected stages, such as the transistor 8, and if a bias potential is applied to the other stage, then it is expected that the frequency multiplier output terminal 10 will not be provided with a base oscillating signal component. This is because, if the respective transistors exhibit similar operating characteristics, and if the base oscillating signal is differentially supplied to the transistors, as shown, then opposite phases of the base oscillating signal will be present at the respective transistor collector electrodes. Now, even with a finite Q, the impedance of the resonant circuit 4 to the base oscillating signal is small enough such that the oppositely phased base oscillating signals provided at opposite terminals thereof will, effectively, cancel each other. Thus, during a positive half cycle of the input base oscillating signal, a positive half cycle of a base oscillating signal component will be provided at the collector electrode of the transistor 9 and a negative half cycle of that component will be provided at the collector electrode of the transistor 8, in accordance with conventional differential amplifier operation. Because of the relatively low impedance of the resonant circuit 4, the positive and negative half cycles will effectively cancel each other at the output terminal 10. A similar operation ensues when a negative half cycle of the base oscillating signal is applied as an input to the differential amplifier multiplier circuit.

Although the frequency multiplier shown in FIG. 2 might operate satisfactorily, the possibility exists that, at the higher frequencies under consideration, the transistors 8 and 9 might not exhibit identical operating characteristics. As an example, the amplification factors of the respective transistors might differ at such frequencies. If this occurs, it is appreciated that the oppositely phased base oscillating signal components which are provided at the respective transistor collector electrodes might not exhibit equal amplitudes. Consequently, these signals might not completely cancel each other, resulting in a base oscillating signal component at the output terminal 10. Such base oscillating signal would have an amplitude proportional to the difference between the amplitudes of the oppositely phased components which are provided at the respective collector electrodes. Thus, in addition to the desired carrier frequency, the output of the frequency multiplier will be provided with an undesired lower frequency base oscillating signal component.

Turning now to FIG. 3, there is schematically illustrated one embodiment of the improved higher frequency modulator of the present invention. The illustrated modulator uses the frequency multiplier shown and described with respect to FIG. 2 as a carrier signal source. Accordingly, as illustrated in FIG. 3, the improved modulator circuit is formed of a base signal oscillator 10, a frequency multiplier 30 and a modulator 90. The base signal oscillator is a crystal oscillator of the Colpitts type including a crystal element 24. As shown, the crystal element produces a signal which is coupled to a differential amplifier 20 formed of the differentially-connected transistors 11 and 12.

The output of the oscillator 10 is differentially supplied to the frequency multiplier 30 which, as shown, is comprised of a differential amplifier 40 formed of differentially-connected transistors 31 and 32. A resonant circuit 41 is connected between the respective collector electrodes of the differentially-connected transistors 31 and 32. Thus, as is apparent, the frequency multiplier 30 is of the type previously described hereinabove with respect to FIG. 2.

The frequency multiplier includes a pair of output terminals, corresponding to the respective electrodes of the transistors 31 and 32, the output terminals being connected to the modulator 90 for supplying the carrier signal thereto. The modulator is an amplitude modulator comprised of differential amplifiers 60 and 80, to which the carrier signal produced by the frequency multiplier 30 is differentially supplied. In particular, the differential amplifier 60 is formed of a pair of differentially-connected transistors 61 and 62 having respective base electrodes which are connected to the respective ouput terminals of the frequency multiplier 30. As is conventional, the differentially-connected transistors have their emitter electrodes connected in common, the common-connected emitters being coupled through an additional transistor 51 and a current source 53 to a reference potential, such as ground.

The differential amplifier 80 is connected in a similar configuration and is comprised of a pair of differentially-connected transistors 81 and 82 having their respective base electrodes connected to the pair of output terminals of the frequency multiplier 30. The transistors 81 and 82 have their emitter electrodes connected in common, and the common-connected emitters are coupled through an additional transistor 72 and through a current source 73 to ground. The collector electrodes of the transistors 61 and 81 are connected in common, as are the collector electrodes of the transistors 62 and 82. For the purpose of this description, and as will soon be further explained, the output terminals of the differential amplifier 60, i.e., the collector electrodes of the transistors 61 and 62, are connected to oppositely phased ones of the output terminals of the differential amplifier 80, i.e., to oppositely phased collector electrodes of the transistors 81 and 82. The term "oppositely phased," as used above and as used throughout this specification, refers to the fact that if only the carrier signal is differentially supplied to each of the differential amplifiers 60 and 80, the resultant carrier signal which is produced at the collector electrode of the transistor 61 is oppositely phased with respect to the carrier signal produced at the collector electrode of the transistor 81. Similarly, the resultant carrier signals which are produced at the collector electrodes of the transistors 62 and 82 are out-of-phase with each other.

The common-connected collectors of the differential amplifiers 60 and 80 are coupled to respective output terminals 91, 92, as shown, and are further coupled through resistive loads to a source of operating potential $+V_{cc}$.

The additional transistor 51 serves as a current source for the differential amplifier 60 and is included in a further differential amplifier 50. As shown, the transistor 51 is differentially-connected to a transistor 52, the latter transistor having its base electrode connected to a signal input terminal 54 to receive an information signal. The base electrode of the transistor 51 is supplied with a suitable bias potential, as figuratively illustrated.

In an analogous manner, the additional transistor 72 serves as a current source for the differential amplifier 80 and is included in a further differential amplifier 70. This further differential amplifier is formed of differentially-connected transistors 71 and 72, the transistor 71 having its base electrode connected to an input terminal 74 to receive a signal. The base electrode of the transistor 72 is adapted to receive a bias potential thereat, as figuratively shown.

In operation, if the carrier signal produced at the output terminals of the frequency multiplier 30 is differentially supplied to the respective differential amplifiers 60 and 80, the resultant current flowing through each of the differentially-connected transistors 61, 62 and 81, 82 will have a frequency equal to the carrier frequency. The currents through the differential amplifier 60 are controlled by the conductivity of the transistor 51. Accordingly, if an information signal is supplied to the input terminal 54, the differential operation of the further differential amplifier 50 will result in a current flowing through the transistor 51 which is a function of the information supplied to the terminal 54. Consequently, the carrier frequency currents flowing through the differential amplifier 60 are modulated by the current which flows through the transistor 51. As a result thereof, an amplitude modulated signal of the type shown in FIG. 4A is obtained at the output terminals of the differential amplifier 60, i.e., at the collector electrodes of the transistors 61 and 62.

At the same time, the carrier signal is differentially supplied to the differential amplifier 80, resulting in carrier frequency currents which flow through the differentially-connected transistor 81 and 82. If, as an example, a DC voltage is applied to the input terminal 74, resultant direct currents flow through the transistor 71 and 72 having a ratio which is proportional to the ratio of the DC voltages applied to the respective base electrodes. Thus, the current flowing through the transistor 72 is a direct current and is determined by the ratio of the DC voltages applied to the transistors 71 and 72. This direct current flowing through the transistor 72 will modulate the carrier frequency currents flowing through the differential amplifier 80 to thereby produce an amplitude modulated signal at the differential amplifier output terminals, i.e., at the collector electrodes of the transistors 81 and 82. This modulated carrier current is shown in FIG. 4B. Of course, it is appreciated that, since the DC voltages applied to the transistors 71 and 72 are constant, the resultant carrier signals at the output terminals of the differential amplifier 80 likewise will have a constant amplitude.

Now, since the respective output terminals of the differential amplifier 60 are connected to output terminals of the differential amplifier 80 having opposite phase relationship with respect to the carrier signal which appears thereat, the level of the carrier output produced by the differential amplifier 80 thus is determinative of the modulation ratio of the amplitude modulated carrier signal produced at the output terminal of the differential amplifier 60. If the resultant AM signal is derived from the modulator output terminals 91 and 92, this amplitude modulated signal Sa will have a modulation factor which increases as the carrier level produced by the differential amplifier 80 increases. As shown in FIG. 4C, if the DC voltage applied to the terminal 74 increases, the modulation factor of the modulator 90 increases such that the signal Sa appears as illustrated at the output terminals 91, 92. Indeed, if the DC voltage applied to the terminal 74 has a magnitude which causes the carrier signal output produced by the differential amplifier 80 to have an amplitude $S_b$, as depicted in FIG. 4D, the modulation factor of the amplitude modulated signal Sa can be increased above 100%, as shown in FIG. 4E. If the signal $S_b$ produced by the differential amplifier 80 is further increased in amplitude, the modulator 90 can produce an overmodulated signal having a modulation factor that is much greater than 100%, as shown by the Signal $S_a$ of FIG. 4F.

It should be appreciated that the control over the modulation factor can be achieved by regulating the current source 73, rather than by supplying modulation factor control voltages to the input terminal 74.

It now will be described why the improved modulator circuit shown in FIG. 3 is not deleteriously influenced by lower frequency components corresponding to the base oscillating signal which might be present at the output of the frequency multiplier 30. It is recognized that the frequency multiplied signal produced by the frequency multiplier 30 is differentially supplied to each of the differential amplifiers 60 and 80. However, as has been described hereinabove with respect to the frequency multiplier of FIG. 2, it is possible that lower frequency components corresponding to the base oscillating signal will be present at the respective collector electrodes of the transistors 31 and 32. As may be recalled, these components could be present if the transistors 31 and 32 exhibit different amplification factors at the frequencies under consideration. Thus, the lower frequency components will not completely cancel each other, and a resultant lower frequency component will be produced across the resonant circuit 41. This resultant lower frequency component, which appears at the output terminals of the frequency multiplier 30, will have the same phase at each output terminal. Thus, whereas the frequency multiplied carrier signal is differentially supplied to the differential amplifiers 60 and 80, the lower frequency base oscillating signal component will be supplied in phase to these differential amplifiers.

Since the collector electrodes of the transistors 61 and 62 are oppositely phased to the collector electrodes of the transistors 81 and 82, as described above, it now is appreciated that the lower frequency base oscillating signal component which is supplied to the transistor 61 produces a corresponding component in the collector electrode of that transistor which is out-of-phase with the same frequency component produced at the collector electrode of the transistor 81. Similarly, the base oscillating signal component which is produced in the collector circuit of the transistor 62 is out-of-phase with the base oscillating signal component which is produced in the collector circuit of the transistor 82. Therefore, as a result of the connections of the oppositely-phased output terminals of the differential amplifiers 60 and 80, whatever base oscillating signal component might be present in the output of the frequency multiplier 30 is effectively cancelled at the output terminals of the differential amplifiers 60 and 80. Of course, since the frequency multiplied carrier signal is differentially supplied to the respective differential amplifiers 60 and 80, a corresponding phase cancellation at the output terminals thereof is not obtained. Consequently, the resultant amplitude modulated signal produced at the modulator output terminals 91, 92 is not accompanied by an undesired lower frequency base oscillating signal component.

It is appreciated that the transistors 51 and 72 function as current control circuits for the respective differential amplifiers 60 and 80. Furthermore, the terminals 54 and 74 receive input signals which serve to regulate the conductivity of the transistors 51 and 72, and thus regulate the differential amplifier current control. Although shown as respective stages of the differential amplifiers 50 and 70, it now should be recognized that the respective transistors 51 and 72 may be supplied directly with control signals, i.e., modulating signals, and the differential amplifiers 50 and 70 may be omitted.

As a further application of the illustrated modulator, the transistor 72, and thus the differential amplifier 70, need not be provided solely for the purpose of determining the modulation factor. Although it has been assumed that a DC voltage is applied to the terminal 74, this assumption has been made for the purpose of simplifying the above explanation. It is contemplated that another information signal can be supplied to the terminal 74 to thereby modulate the carrier currents flowing through the differential amplifier 80. Accordingly, in one envisaged application of this invention, a video information signal can be supplied to the terminal 54 and an audio information signal can be supplied to the terminal 74. This, of course, is most useful in television signal processing. As one example, the audio signal applied to the terminal 74 may be applied as an audio signal which is frequency modulated onto a carrier. If the carrier signal produced by the multiplier 30 is assumed to have a frequency equal to 90MHz, the frequency-modulated audio signal may be assumed to have a carrier frequency of 4.5MHz. Thus, in such an application, the modulator output terminals 91 and 92 will supply a television signal formed of a carrier which is modulated with a video signal and an audio signal. Those of ordinary skill in the television art will appreciate that this type of modulating signal corresponds to a broadcasted television signal. Thus, the modulator of this invention can be readily used in VTR applications wherein the output terminals 91 and 92 are coupled to a television receiver and the input terminals 54 and 74 are adapted to receive the video and audio signals which are reproduced by the VTR apparatus. Thus, the usual television signal will be supplied to the television receiver by the modulator ouput terminals 91 and 92.

Of course, if the illustrated modulator is used in television applications, the audio signal applied to the input terminal 74 need not necessarily be modulated onto a carrier by frequency modulation techniques. As an alternative example, if the so-called SECAM signal is used, the audio signal applied to the terminal 74 may be modulated onto a carrier by amplitude modulation techniques.

Therefore, it now should be readily apparent that the modulator circuit as described herein is adapted to modulate an information signal onto a higher frequency carrier while suppressing lower frequency components which are related to the carrier from appearing in the modulator output. Thus, if desired, the information signal which is used to modulate the currents flowing through the differential amplifier 60 may also be used to modulate the currents flowing through the differential amplifier 80. In such an application, it is appreciated that the various signal polarities and phases must be taken into account to be compatible with the particular application of the modulator.

While the invention has been particularly shown and described with reference to one preferred embodiment thereof, it will be obvious to those skilled in the art that the foregoing and various other changes and modifications in form and details may be made without departing from the spirit and scope of the invention. It is, therefore, intended that the appended claims be interpreted as including all such changes and modifications.

What is claimed is:

1. Apparatus for high-frequency modulation, comprising:
    means for supplying a base oscillating signal;
    frequency multiplying means including first differential amplifier means having a pair of output terminals, said frequency multiplying means receiving said base oscillating signal and producing at said pair of output terminals a carrier signal having a frequency equal to a predetermined multiple of the frequency of said base oscillating signal; and
    modulating means including second and third differential amplifier means for receiving said carrier signal and for modulating same with input information, said modulating means being coupled to said frequency multiplying means such that said carrier signal is applied differentially to each of said second and third differential amplifiers and said input information is supplied to at least one of said second and third differential amplifiers; said second differential amplifier having a pair of output terminals connected, respectively, to a pair of output terminals of said third differential amplifier, the connected output terminals having opposite phase relationships with respect to each other when said carrier signal is differentially applied to said second and third differential amplifiers.

2. Apparatus in accordance with claim 1 wherein said frequency multiplying means further includes resonant circuit means connected across said first differential amplifier means output terminals and wherein each of said second and third differential amplifiers has a pair of input terminals connected to respective ones of said first differential amplifier means output terminals.

3. Apparatus in accordance with claim 2 wherein each of said second and third differential amplifiers comprises differentially-connected transistor means having a common connection, and said modulating means further comprises current control means coupled to at least one of said common connections, and means for regulating said current control means in accordance with said input information.

4. Apparatus in accordance with claim 3 wherein said current control means comprises:
   first current regulating means coupled to said second differential amplifier common connection for regulating the current through said second differential amplifier;
   second current regulating means coupled to said third differential amplifier common connection for regulating the current through said third differential amplifier; and
   means for applying input signals representing said information to said first and second current regulating means.

5. Apparatus in accordance with claim 3 wherein said modulating means further comprises means coupled to one of said second and third differential amplifiers for controlling the modulation factor of said modulating means.

6. An amplitude modulator for modulating a high frequency carrier, comprising:
   means for supplying a base oscillating signal;
   frequency multiplying means for receiving said base oscillating signal and including a first differential amplifier having a pair of output terminals and resonant circuit means connected between said pair of output terminals for multiplying the frequency of said base oscillator signal to produce said high frequency carrier;
   a second differential amplifier comprised of differentially-connected transistor means having a common connection and including a pair of input terminals connected to said first differential amplifier output terminals, respectively, and a pair of output terminals;
   a third differential amplifier comprised of differentially-connected transistor means having a common connection and including a pair of input terminals connected to said first differential amplifier output terminals, respectively, and a pair of output terminals;
   means for connecting said second differential amplifier output terminals to oppositely phased ones of said third differential amplifier output terminals to thereby cancel any of said base oscillating signal which is supplied to said second and third differential amplifiers;
   first means connected to said second differential amplifier common connection for varying the carrier currents flowing through said second differential amplifier in accordance with a signal applied thereto; and
   second means connected to said third differential amplifier common connection for varying the carrier currents flowing through said third differential amplifier in accordance with a signal applied thereto.

7. An amplitude modulator in accordance with claim 6 wherein said first and second means comprises first and second pairs of differentially-connected transistors, respectively, one of said transistors in each of said first and second pairs having its collector-emitter circuit connected in series with said second and third differential amplifier common connections, respectively.

8. An amplitude modulator in accordance with claim 7, further comprising means for supplying modulating signals to said first and second pairs of differentially-connected transistors.

9. An amplitude modulator in accordance with claim 8 wherein the modulating signal supplied to said first pair of differentially-connected transistors is an information signal and the modulating signal supplied to said second pair of differentially-connected transistors is a modulation factor determining signal.

10. An amplitude modulator in accordance with claim 8 wherein the modulating signal supplied to said first pair of differentially-connected transistors is a video information signal and the modulating signal supplied to said second pair of differentially-connected transistors is an audio information signal.

* * * * *